United States Patent
Kim et al.

(10) Patent No.: US 12,252,781 B2
(45) Date of Patent: Mar. 18, 2025

(54) AREA-SELECTIVE METHOD FOR FORMING THIN FILM BY USING NUCLEAR GROWTH RETARDATION

(71) Applicant: EGTM Co., Ltd., Suwon-si (KR)

(72) Inventors: Jae Min Kim, Suwon-si (KR); Ha Na Kim, Suwon-si (KR); Woong Jin Choi, Suwon-si (KR); Ji Yeon Han, Suwon-si (KR); Ju Hwan Jeong, Suwon-si (KR); Hyeon Sik Cho, Suwon-si (KR)

(73) Assignee: EGTM CO., LTD., Suwon-si (KR)

( * ) Notice: Subject to any disclaimer, the term of this patent is extended or adjusted under 35 U.S.C. 154(b) by 37 days.

(21) Appl. No.: 18/260,402

(22) PCT Filed: Jan. 5, 2022

(86) PCT No.: PCT/KR2022/000171
§ 371 (c)(1),
(2) Date: Jul. 5, 2023

(87) PCT Pub. No.: WO2022/149854
PCT Pub. Date: Jul. 14, 2022

(65) Prior Publication Data
US 2024/0068091 A1    Feb. 29, 2024

(30) Foreign Application Priority Data
Jan. 5, 2021   (KR) .................. 10-2021-0000980

(51) Int. Cl.
*C23C 16/04*    (2006.01)
*C23C 16/40*    (2006.01)

(52) U.S. Cl.
CPC ............ *C23C 16/04* (2013.01); *C23C 16/401* (2013.01)

(58) Field of Classification Search
CPC ............................. C23C 16/04; C23C 16/401
See application file for complete search history.

(56) References Cited

U.S. PATENT DOCUMENTS

| 8,293,658 | B2 | 10/2012 | Shero et al. |
| 2001/0054769 | A1 | 12/2001 | Raaijmakers et al. |
| | | (Continued) | |

FOREIGN PATENT DOCUMENTS

| JP | 5-152250 | * 6/1993 | .......... H01L 21/285 |
| KR | 10-2013-0005262 A | 1/2013 | |
| | (Continued) | | |

OTHER PUBLICATIONS

Kumar, Navneet, et al., "Growth Inhibition to Enhance Conformal Coverage in Thin Film Chemical Vapor Deposition". Journal American Chemical Society, 2008, 130, 17660-17661.*

(Continued)

*Primary Examiner* — Bret P Chen
(74) *Attorney, Agent, or Firm* — You & IP, LLC

(57) ABSTRACT

Disclosed is a method of forming an area-selective thin film, the method comprising supplying a nuclear growth retardant to the inside of the chamber in which the substrate is placed, so that the nuclear growth retardant is adsorbed to a non-growth region of the substrate; purging the interior of the chamber; supplying a precursor to the inside of the chamber, so that the precursor is adsorbed to a growth region of the substrate; purging the interior of the chamber; and supplying a reaction material to the inside of the chamber, so that the reaction material reacts with the adsorbed precursor to form the thin film.

30 Claims, 6 Drawing Sheets

(56) References Cited

U.S. PATENT DOCUMENTS

| | | | |
|---|---|---|---|
| 2011/0120544 A1* | 5/2011 | Levy | H01L 21/0228 427/256 |
| 2014/0251418 A1* | 9/2014 | Chen | H01L 31/022466 438/98 |
| 2016/0148839 A1* | 5/2016 | Abelson | C23C 16/18 438/608 |
| 2017/0012001 A1 | 1/2017 | Gordon et al. | |
| 2017/0117142 A1 | 4/2017 | Lee et al. | |
| 2020/0185225 A1 | 6/2020 | Wang et al. | |
| 2021/0130954 A1 | 5/2021 | Lee et al. | |

FOREIGN PATENT DOCUMENTS

| | | | |
|---|---|---|---|
| KR | 10-2015-0108779 A | 9/2015 | |
| KR | 10-2095710 B1 | 4/2020 | |
| KR | 10-2022-0032850 A | 3/2022 | |
| WO | 2004-049432 A2 | 6/2004 | |
| WO | WO 2021/060860 | * 4/2021 | H01L 21/02 |

OTHER PUBLICATIONS

Mameli, Alfredo, et al., "Area-Selective Atomic Layer Deposition of SiO2 Using Acetylacetone as a Chemoselective Inhibitor in an ABC-Type Cycle". ACS Nano 2017, 11, 9303-9311.*

Silk, Wendy K., et al., "Deposition rates in growing tissue: Implications for physiology, molecular biology, and response to environmental variation". Plant Soil (2014) 374:1, 1-17.*

* cited by examiner

| Cycle | Si | SiN | SiO | TiN | HfO | NbO |
|---|---|---|---|---|---|---|
| 0 | 0 | 0 | 0 | 0 | 0 | 0 |
| 50 | 54.28 | 52.95 | 55.68 | 47.31 | 49.74 | 54.32 |
| 100 | 115.44 | 114.45 | 117.05 | 105.12 | 107.64 | 119.1 |
| 150 | 173.31 | 171.3 | 175.47 | 157.89 | 166.12 | 180.17 |
| 200 | 231.18 | 228.7 | 233.48 | 221.74 | 221.53 | 238.49 |

FIG. 4

| Cycle | Si | SiN | SiO | TiN | HfO | NbO |
|---|---|---|---|---|---|---|
| 0 | 0 | 0 | 0 | 0 | 0 | 0 |
| 50 | 49.21 | 49.23 | 50.09 | 10.28 | 0 | 0 |
| 100 | 105.1 | 107.35 | 99.59 | 65.28 | 51.62 | 0 |
| 150 | 155.05 | 152.92 | 148.67 | 110.84 | 96.66 | 10.35 |
| 200 | 212.26 | 207.83 | 208.26 | 158.9 | 153.3 | 70.12 |

FIG. 6

AREA-SELECTIVE METHOD FOR FORMING THIN FILM BY USING NUCLEAR GROWTH RETARDATION

TECHNICAL FIELD

The present invention relates to a method of formation of thin film, and more particularly, to a method of selective formation of thin film using nuclear growth retardation.

BACKGROUND

Patterning of a semiconductor device is performed using an arrangement of various material layers and a lithography or etching process. However, over the past few decades, miniaturization of device has accelerated and the size of a required pattern has been reduced to the nanometer (nm) level, which greatly increases cost and time for nano-pattern formation. In addition, development of a selective deposition process capable of obtaining a self-aligned structure without the need to perform a subsequent process is required.

An object of the present invention is to provide a method for forming a thin film that has a selectivity in relation to an area.

Other objects of the present invention will become more apparent from the following detailed description.

SUMMARY

Disclosed is a method of forming an area-selective thin film, the method comprising supplying a nuclear growth retardant to the inside of the chamber in which the substrate is placed, so that the nuclear growth retardant is adsorbed to a non-growth region of the substrate; purging the interior of the chamber; supplying a precursor to the inside of the chamber, so that the precursor is adsorbed to a growth region of the substrate; purging the interior of the chamber; and supplying a reaction material to the inside of the chamber, so that the reaction material reacts with the adsorbed precursor to form the thin film.

The nuclear growth retardant may be represented by the following Chemical Formula 1:

<Chemical Formula 1>

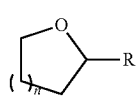

in <Chemical Formula 1>, n is 1 or 2, R is selected from a hydrogen, an alkyl group having 1 to 5 carbon atoms, an cycloalkyl group having 3 to 6 carbon atoms, and an aryl group having 6 to 12 carbon atoms.

The nuclear growth retardant may be represented by the following Chemical Formula 2:

<Chemical Formula 2>

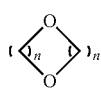

in <Chemical Formula 2>, n is each independently an integer of 1 to 5.

The nuclear growth retardant may be represented by the following Chemical Formula 3:

<Chemical Formula 3>

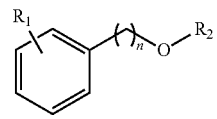

in <Chemical Formula 3>, n is each independently an integer of 0 to 8,

R1 is each independently selected from an alkyl group having 1 to 10 carbon atoms, an alkoxy group having 1 to 5 carbon atoms, and a hydrogen, R2 is each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 4:

<Cheimcal Formula 4>

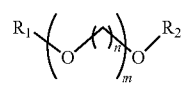

in <Chemical Formula 4>, n is each independently an integer of 1 to 8, m is each independently an integer of 1 to 5, R1 and R2 are each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 5:

<Chemical Formula 5>

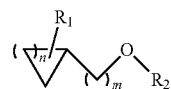

in <Chemical Formula 5>, n is each independently an integer of 1 to 5, m is each independently an integer of 0 to 8, R1 is each independently selected from an alkyl group having 1 to 8 carbon atoms and a hydrogen, R2 is each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 6:

<Chemical Formula 6>

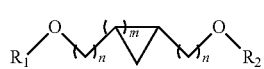

in <Chemical Formula 6>, n is each independently an integer of 1 to 8, m is each independently an integer of 1 to 6, R1 and R2 are each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 7:

<Chemical Formula 7> in <Chemical Formula 7>, n is each independently an integer of 0 to 5, m is each independently an integer of 1 to 5, R is each independently selected from an alkyl group having 1 to 10 carbon atoms, a cycloalkyl group having 3 to 10 carbon atoms, and an aryl group having 6 to 12 carbon atoms.

The nuclear growth retardant may be represented by the following Chemical Formula 8:

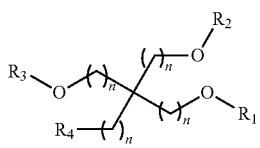

<Chemical Formula 8> in <Chemical Formula 8>, n is each independently an integer of 0 to 8,

R1 to R3 are each independently selected from an alkyl group having 1 to 8 carbon atoms, R4 is each independently selected from a hydrogen, an alkyl group having 1 to 6 carbon atoms, and an alkoxy group having 1 to 8 carbon atoms.

The non-growth region may be a metal-containing film having at least one of Group 1 to Group 13 elements as a pivotal element.

The metal-containing film may have at least one of Group 4 elements including Zr, Hf, and Ti as a pivotal element.

The metal-containing film may have at least one of Group 5 elements including Nb and Ta as a pivotal element.

The metal-containing film may have at least one of Group 6 elements including W as a pivotal element.

The metal-containing film may have at least one of Group 11 elements including Cu as a pivotal element.

The metal-containing film may have at least one of Group 13 elements including Al as a pivotal element.

The metal-containing film may be a metal itself.

The metal-containing film may be a metal oxide.

The metal-containing film may be a metal nitride.

The growth region may have at least one of Group 14 elements including Si, Ge as a pivotal element.

The growth region may be a silicon-containing film.

The silicon-containing film may be at least one selected from Si, SiO, SiN, SiCN, C-doped SiN, and SiON.

The growth region may be a germanium-containing film.

The precursor may be an organic compound having at least one of Group 14 elements including Si and Ge as a pivotal element.

The precursor may be represented by the following Chemical Formula 9:

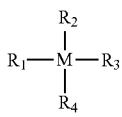

<Chemical Formula 9> in <Chemical Formula 9>, M is one of Group 14 elements including Si and Ge,

R1 to R4 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 10:

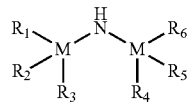

<Chemical Formula 10> in <Chemical Formula 10>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 11:

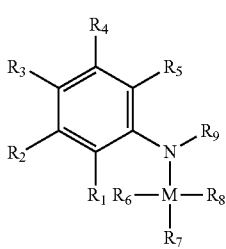

<Chemical Formula 11> in <Chemical Formula 11>, M is one of Group 14 elements including Si and Ge,

R1 to R5 are each independently selected from a hydrogen, an alkyl group having 1 to 10 carbon atoms, R6 to R9 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 12:

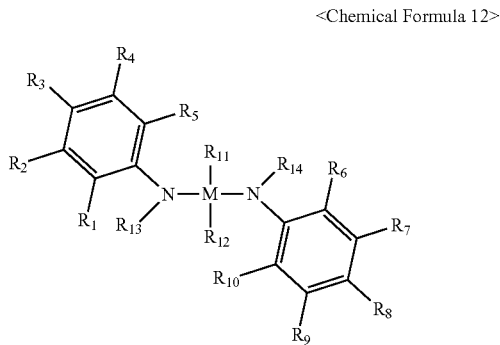

<Chemical Formula 12> in <Chemical Formula 12>, M is one of Group 14 elements including Si and Ge,

R1 to R10 are each independently selected from a hydrogen, an alkyl group having 1 to 10 carbon atoms, R11 to R14 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 13:

<Chemical Formula 13> in <Chemical Formula 12>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The reaction material may be at least one selected from O3, O2, H2O, HO2, N2O, and NH3.

The thin film may be formed by a Metal Organic Chemical Vapor Deposition (MOCVD) or an Atomic Layer Deposition (ALD).

BRIEF DESCRIPTION OF THE DRAWINGS

FIGS. 3 and 4 show the thickness of the silicon oxide film per cycle according to Comparative Example of the present invention.

FIGS. 5 and 6 show the thickness of the silicon oxide film per cycle according to an embodiment of the present invention.

DETAILED DESCRIPTION

Figure 1:
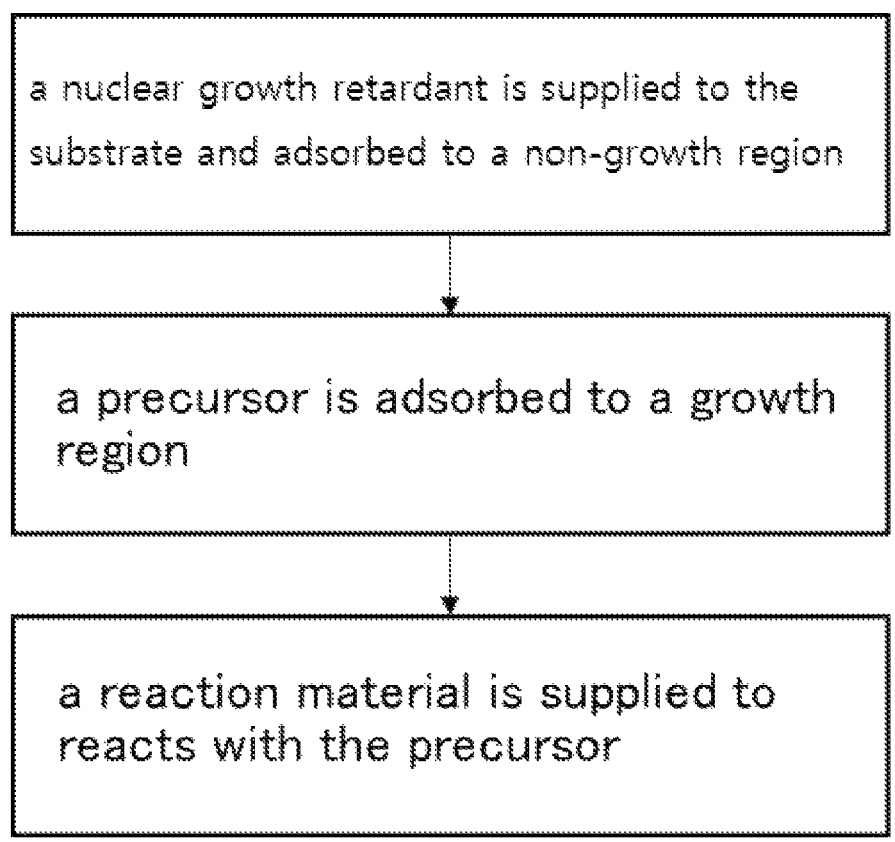
FIG. 1 is a flowchart schematically demonstrating a method of forming a thin film according to an embodiment of the present invention.

Hereinafter, embodiments of the present invention will be described using FIGS. 1 to 6. The embodiments of the present invention may include various modifications, and the scope of the present invention should not be construed to be limited to the embodiments described below. These embodiments are provided to explain the present invention in more detail to those of ordinary skill in the art to which the present invention pertains. Accordingly, the shape of each element shown in the drawings may be exaggerated to emphasize a clearer description.

Throughout this specification, when a part "includes" a certain component, it means that other components may be further included, rather than excluding other components, unless otherwise stated.

As used throughout this specification, the terms "about," "substantially," and the like are used in a sense at or close to the numerical value when the manufacturing and material tolerances inherent in the stated meaning are presented, and are intended to prevent unfair use of the disclosures including precise or absolute figures for the understanding of the present invention by unconscionable infringers.

Throughout this specification, the term "alkyl" or "alkyl group" refers to 1 to 12 carbon atoms, 1 to 10 carbon atoms, 1 to 8 carbon atoms, 1 to 5 carbon atoms, 1 to 3 carbon atoms, straight or branched alkyl groups having from 3 to 8 carbon atoms, or from 3 to 5 carbon atoms. For example, the alkyl group includes a methyl group, an ethyl group, an n-propyl group (nPr), an iso-propyl group (iPr), an n-butyl group (nBu), a tert-butyl group (tBu), an iso-butyl group (iBu)), sec-butyl group (sBu), n-pentyl group, tert-pentyl group, iso-pentyl group, sec-pentyl group, neopentyl group, 3-pentyl group, hexyl group, isohexyl group, heptyl group, 4,4-dimethylpentyl group, octyl group, 2,2,4-trimethylpentyl group, nonyl group, decyl group, undecyl group, dodecyl group, and isomers thereof, but may not be limited thereto.

Throughout this specification, the term "film" may include, but is not limited to, "thin film".

When the thin film is deposited by the atomic layer deposition method, the reactant is not deposited on the substrate or the lower layer in the initial cycle, and several cycles may be required for deposition. Such a period is referred to as an incubation time, and the incubation time may vary depending on various conditions such as properties of reactants and properties of the substrate or the lower layer. The present invention seeks to overcome the limitations of the prior art and provides an improved method for the selective deposition of thin film using differences of the incubation time and the ALD deposition processes.

Figure 2:
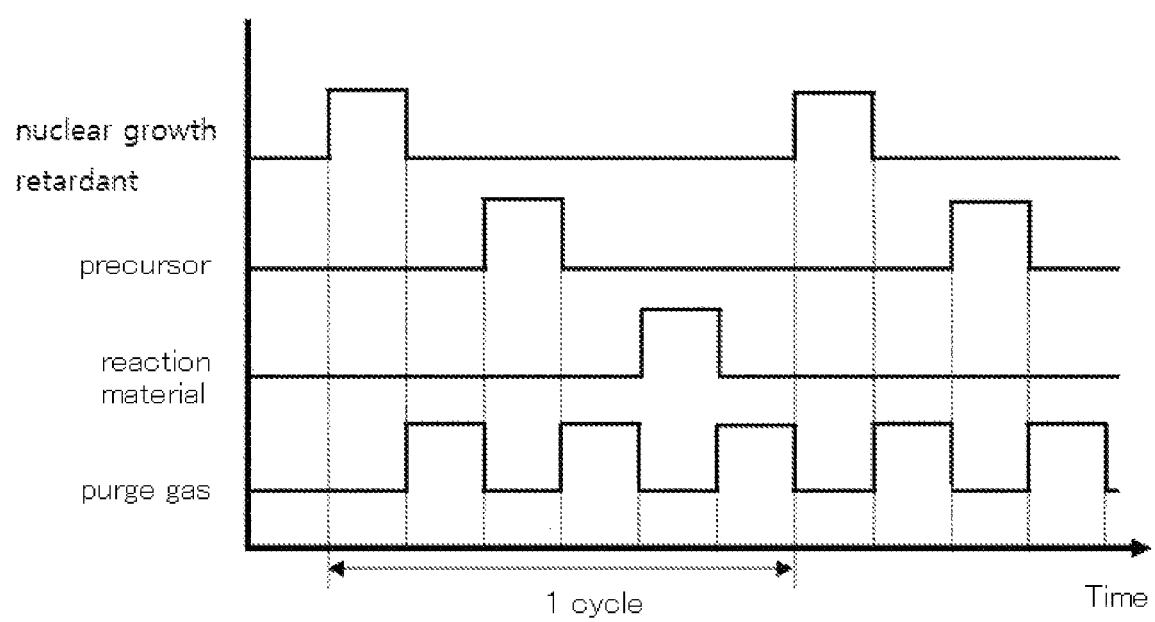
FIG. 2 is a graph schematically demonstrating a supply cycle according to FIG. 1.

FIG. 1 is a flowchart schematically demonstrating a method of forming a thin film according to an embodiment of the present invention, and FIG. 2 is a graph schematically demonstrating a supply cycle according to FIG. 1.

A substrate is loaded into a process chamber, and following ALD process conditions are adjusted. ALD process conditions may include a temperature of the substrate or process chamber, a pressure in the process chamber, gas flow rate.

The substrate is exposed to the nuclear growth retardant supplied to the interior of the chamber, and the nuclear growth retardant is adsorbed to the surface of the substrate. The substrate has a non-growth region and a growth region, the nuclear growth retardant is adsorbed on the non-growth region and the growth region to prevent adsorption of the metal precursor in a subsequent process.

The non-growth region may be a metal-containing film having at least one of Group 1 to Group 13 elements as a pivotal element. Specifically, the metal-containing film may have at least one of Group 4 elements including Zr, Hf, and Ti as a pivotal element. The metal-containing film may have at least one of Group 5 elements including Nb and Ta as a pivotal element. The metal-containing film may have at least one of Group 6 elements including W as a pivotal element. The metal-containing film may have at least one of Group 11 elements including Cu as a pivotal element. The metal-containing film may have at least one of Group 13 elements including Al as a pivotal element. The metal-containing film may be a metal itself, a metal oxide, or a metal nitride.

The growth region may have at least one of Group 14 elements including Si, Ge as a pivotal element. Specifically, the growth region may be a silicon-containing film. The silicon-containing film may be at least one selected from Si, SiO, SiN, SiCN, C-doped SiN, and SiON. Also, the growth region may be a germanium-containing film.

The nuclear growth retardant may be represented by the following Chemical Formula 1:

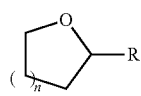

<Chemical Formula 1> in <Chemical Formula 1>, n is 1 or 2, R is selected from a hydrogen, an alkyl group having 1 to 5 carbon atoms, an cycloalkyl group having 3 to 6 carbon atoms, and an aryl group having 6 to 12 carbon atoms.

The nuclear growth retardant may be represented by the following Chemical Formula 2:

<Chemical Formula 2> in <Chemical Formula 2>, n is each independently an integer of 1 to 5.

The nuclear growth retardant may be represented by the following Chemical Formula 3:

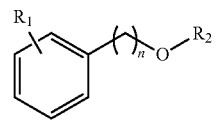

<Chemical Formula 3> in <Chemical Formula 3>, n is each independently an integer of 0 to 8,

R1 is each independently selected from an alkyl group having 1 to 10 carbon atoms, an alkoxy group having 1 to 5 carbon atoms, and a hydrogen, R2 is each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 4:

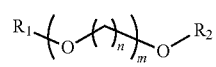

<Chemical Formula 4> in <Chemical Formula 4>, n is each independently an integer of 1 to 8, m is each independently an integer of 1 to 5, R1 and R2 are each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 5:

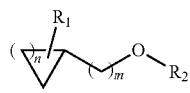

<Chemical Formula 5> in <Chemical Formula 5>, n is each independently an integer of 1 to 5, m is each independently an integer of 0 to 8, R1 is each independently selected from an alkyl group having 1 to 8 carbon atoms and a hydrogen, R2 is each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 6:

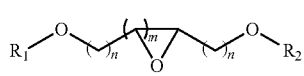

<Chemical Formula 6> in <Chemical Formula 6>, n is each independently an integer of 1 to 8, m is each independently an integer of 1 to 6, R1 and R2 are each independently selected from an alkyl group having 1 to 8 carbon atoms, a cycloalkyl group having 3 to 6 carbon atoms, and an aryl group having 6 to 12 carbon atoms.

The nuclear growth retardant may be represented by the following Chemical Formula 7:

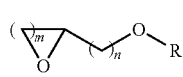

<Chemical Formula 7> in <Chemical Formula 7>, n is each independently an integer of 0 to 5, m is each independently an integer of 1 to 5, R is each independently selected from an alkyl group having 1 to 10 carbon atoms, a cycloalkyl group having 3 to 10 carbon atoms, and an aryl group having 6 to 12 carbon atoms.

The nuclear growth retardant may be represented by the following Chemical Formula 8:

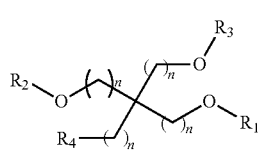

<Chemical Formula 8> in <Chemical Formula 8>, n is each independently an integer of 0 to 8,

R1 to R3 are each independently selected from an alkyl group having 1 to 8 carbon atoms, R4 is each independently selected from a hydrogen, an alkyl group having 1 to 6 carbon atoms, and an alkoxy group having 1 to 8 carbon atoms.

Thereafter, a purge gas (for example, an inert gas such as Ar) is supplied to the interior of the chamber to discharge the unadsorbed nuclear growth retardant or by-products.

Thereafter, the substrate is exposed to a precursor supplied to the interior of the chamber, and the precursor is adsorbed on the surface of the substrate. The precursor may be an organic compound having at least one of Group 14 elements including Si and Ge as a pivotal element.

The precursor may be represented by the following Chemical Formula 9:

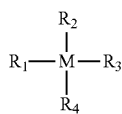

<Chemical Formula 9> in <Chemical Formula 9>, M is one of Group 14 elements including Si and Ge,

R1 to R4 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 10:

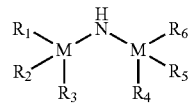

<Chemical Formula 10> in <Chemical Formula 10>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 11:

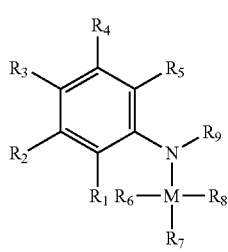

<Chemical Formula 11> in <Chemical Formula 11>, M is one of Group 14 elements including Si and Ge,

R1 to R5 are each independently selected from a hydrogen, an alkyl group having 1 to 10 carbon atoms, R6 to R9 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 12:

<Chemical Formula 12>

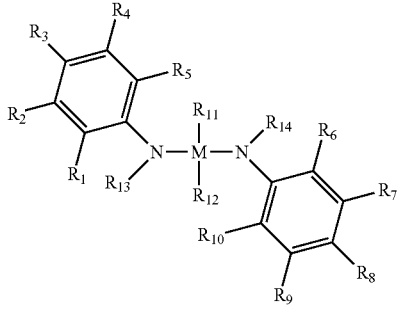

in <Chemical Formula 12>, M is one of Group 14 elements including Si and Ge,

R1 to R10 are each independently selected from a hydrogen, an alkyl group having 1 to 10 carbon atoms, R11 to R14 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

The precursor may be represented by the following Chemical Formula 13:

<Chemical Formula 13>

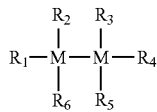

in <Chemical Formula 12>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

Thereafter, a purge gas (for example, an inert gas such as Ar) is supplied to the interior of the chamber to discharge the unadsorbed precursor or by-products.

Thereafter, the substrate is exposed to a reactant supplied to the interior of the chamber, and a thin film is formed on the surface of the substrate. The reactant reacts with the metal precursor to form the thin film, and the reactant may be selected from O3, O2, H2O, H2O2, N2O, NH3. The reactant is for forming oxides and nitrides, and may be replaced with materials other than those exemplified.

Thereafter, a purge gas (for example, an inert gas such as Ar) is supplied to the interior of the chamber to discharge the unreacted material or by-products.

Embodiment

A silicon oxide film was formed on a Si/SiN/SiO/TiN/HfO/NbO lower layers, respectively, using the aforementioned nuclear growth retardant, and the lower layers were a substrate itself or formed through an ALD process. The silicon oxide film was formed through the ALD process, the process temperature was 320° C., and the reactant was ozone gas (O3).

The process of forming the silicon oxide film through the ALD process is as follows, and the following process was performed as one cycle (refer to FIGS. 1 and 2).

1) A nuclear growth retardant is supplied to the reaction chamber to be adsorbed onto the substrate.
2) Ar gas is supplied into the reaction chamber to discharge unadsorbed nuclear growth retardant or by-products.
3) Ar is used as a carrier gas, the silicon precursor (DIPAS, Diisopropylamino Silane) is supplied to the reaction chamber, and the silicon precursor is adsorbed onto the substrate.
4) Ar gas is supplied into the reaction chamber to discharge unadsorbed silicon precursor or byproducts.
5) A silicon oxide film is formed by supplying ozone gas (O3) to the reaction chamber.
6) Ar gas is supplied into the reaction chamber to discharge unreacted substances or by-products.

COMPARATIVE EXAMPLE

A silicon oxide film was formed on a Si/SiN/SiO/TiN/HfO/NbO lower layers, respectively, without using the aforementioned nuclear growth retardant, and the lower layers were a substrate itself or formed through an ALD process. The silicon oxide film was formed through the ALD process, the process temperature was 320° C., and the reactant was ozone gas (O3).

The process of forming the silicon oxide film through the ALD process is as follows, and the following process was performed as one cycle.

1) Ar is used as a carrier gas, the silicon precursor (DIPAS, Diisopropylamino Silane) is supplied to the reaction chamber, and the silicon precursor is adsorbed onto the substrate.
2) Ar gas is supplied into the reaction chamber to discharge unadsorbed silicon precursor or byproducts.
3) A silicon oxide film is formed by supplying ozone gas (O3) to the reaction chamber.
4) Ar gas is supplied into the reaction chamber to discharge unreacted substances or by-products.

Figure 3:
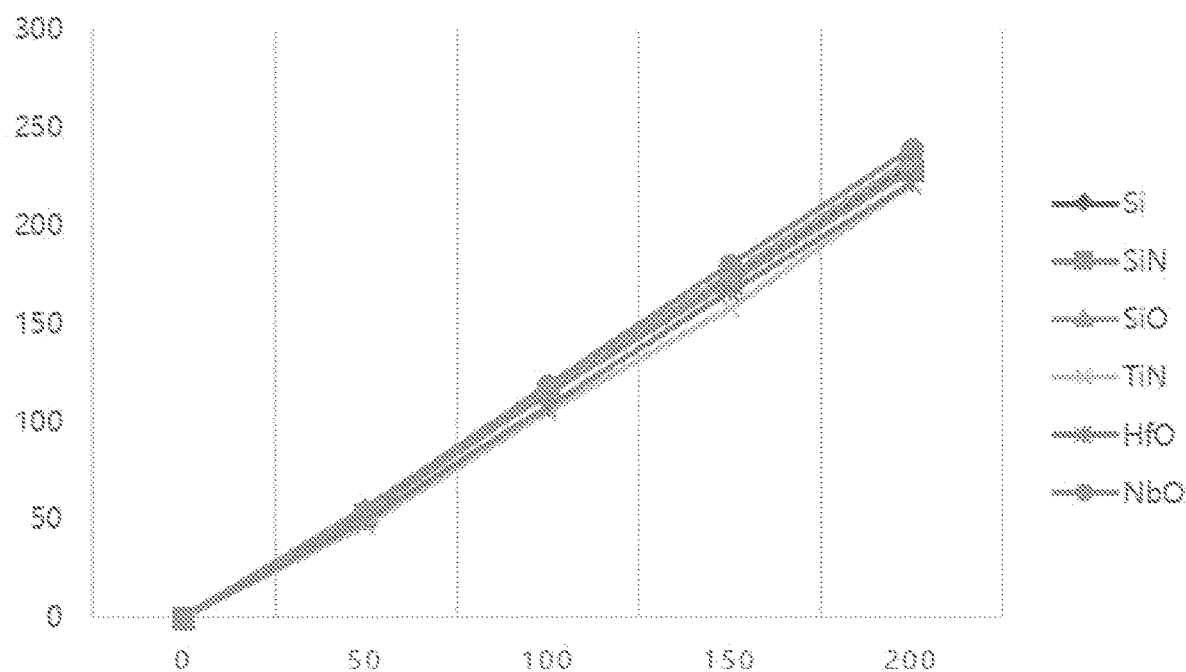
Figure 5:
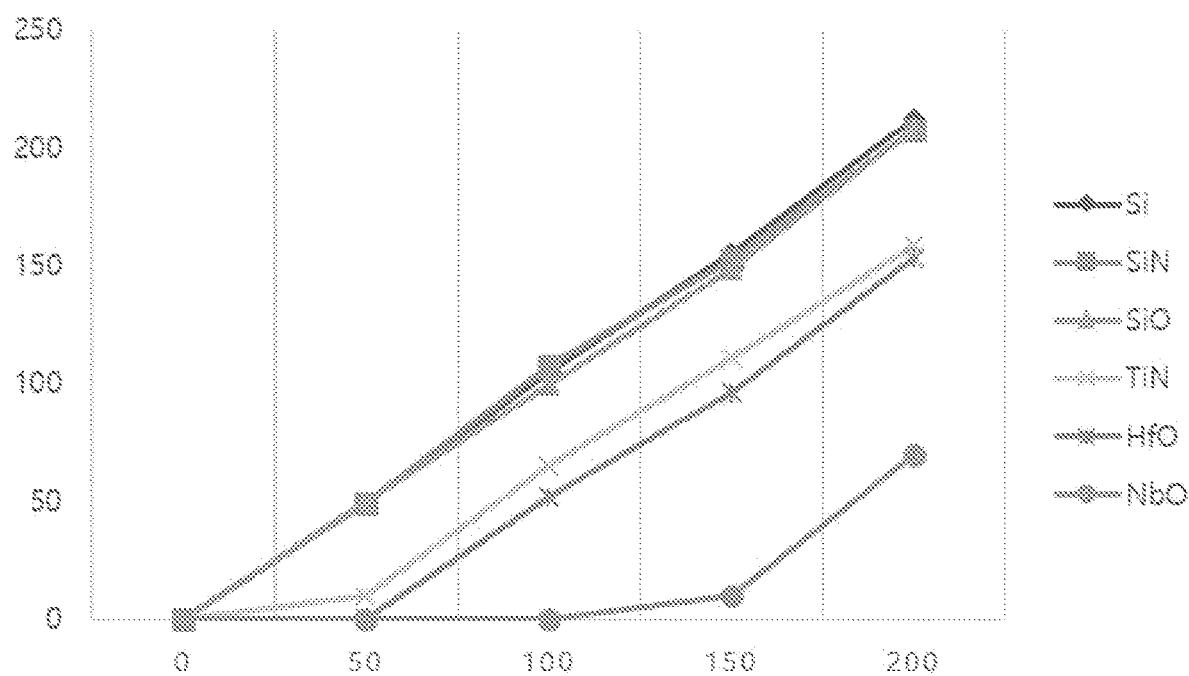

FIGS. 3 and 4 show the thickness of the silicon oxide film per cycle according to Comparative Example of the present invention, FIGS. 5 and 6 show the thickness of the silicon oxide film per cycle according to an embodiment of the present invention.

In the case of the Comparative Example, DIPAS used as the Si-containing precursor does not have a incubation time without selectivity depending on the underlying film (or substrate). Whereas in the case of the Embodiment, the incubation time appears differently depending on the underlying film (or substrate), and it can be seen that the selectivity is secured in a specific cycle.

These results are interpreted as occurring due to the difference in the incubation time, and the difference in the incubation time is interpreted as occurring by varying the adsorption strength (degree) of the nuclear growth retardant depending on the underlying layer (or substrate). That is, in the case of a lower layer (or substrate) with a strong adsorption strength (degree), the effect of hindering the adsorption of the precursor is large, it is difficult for the precursor to be adsorbed and nucleated. Also, the nucleation density is low. Whereas in the case of a lower layer (or substrate) with a weak adsorption strength (degree), the effect of hindering the adsorption of the precursor is small, it is easy for the precursor to be adsorbed and nucleated. Also, the nucleation density is large. And, desired selectivity can be obtained as a result of other complex causes.

According to an embodiment of the present invention, in a state in which the nuclear growth retardant is adsorbed to the non-growth region, the precursor is prevented from being adsorbed to the non-growth region, thereby preventing the formation of a thin film in the non-growth region.

The present invention has been explained in detail with reference to embodiments, but other embodiments may be included. Accordingly, the technical idea and scope described in the claims below are not limited to the embodiments.

The invention claimed is:

1. A method of forming an area-selective thin film, the method comprising:
   supplying a nuclear growth retardant to the inside of the chamber in which the substrate is placed, so that the nuclear growth retardant is adsorbed to a non-growth region of the substrate;
   purging the interior of the chamber;
   supplying a precursor to the inside of the chamber, so that the precursor is adsorbed to a growth region of the substrate;
   purging the interior of the chamber; and
   supplying a reaction material to the inside of the chamber, so that the reaction material reacts with the adsorbed precursor to form the thin film.

2. The method of claim 1, wherein the nuclear growth retardant is represented by the following Chemical Formula 1:

<Chemical Formula 1>

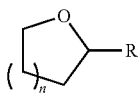

in <Chemical Formula 1>, n is 1 or 2, R is selected from a hydrogen, an alkyl group having 1 to 5 carbon atoms, an cycloalkyl group having 3 to 6 carbon atoms, and an aryl group having 6 to 12 carbon atoms.

3. The method of claim 1, wherein the nuclear growth retardant is represented by the following Chemical Formula 2:

<Chemical Formula 2>

in <Chemical Formula 2>, n is each independently an integer of 1 to 5.

4. The method of claim 1, wherein the nuclear growth retardant is represented by the following Chemical Formula 3:

<Chemical Formula 3>

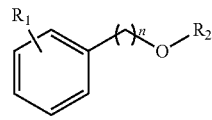

in <Chemical Formula 3>, n is each independently an integer of 0 to 8,
R1 is each independently selected from an alkyl group having 1 to 10 carbon atoms, an alkoxy group having 1 to 5 carbon atoms, and a hydrogen,
R2 is each independently selected from an alkyl group having 1 to 8 carbon atoms, a cycloalkyl group having 3 to 6 carbon atoms, and an aryl group having 6 to 12 carbon atoms.

5. The method of claim 1, wherein the nuclear growth retardant is represented by the following Chemical Formula 4:

<Chemical Formula 4>

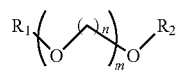

in <Chemical Formula 4>, n is each independently an integer of 1 to 8,
m is each independently an integer of 1 to 5,
R1 and R2 are each independently selected from an alkyl group having 1 to 8 carbon atoms, a cycloalkyl group having 3 to 6 carbon atoms, and an aryl group having 6 to 12 carbon atoms.

6. The method of claim 1, wherein the nuclear growth retardant is represented by the following Chemical Formula 5:

<Chemical Formula 5>

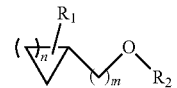

in <Chemical Formula 5>, n is each independently an integer of 1 to 5,
m is each independently an integer of 0 to 8,
R1 is each independently selected from an alkyl group having 1 to 8 carbon atoms and a hydrogen,
R2 is each independently selected from an alkyl group having 1 to 8 carbon atoms, a cycloalkyl group having 3 to 6 carbon atoms, and an aryl group having 6 to 12 carbon atoms.

7. The method of claim 1, wherein the nuclear growth retardant is represented by the following Chemical Formula 6:

<Chemical Formula 6>

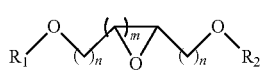

in <Chemical Formula 6>, n is each independently an integer of 1 to 8, m is each independently an integer of 1 to 6, R1 and R2 are each independently selected from an alkyl group having 1 to 8 carbon atoms, a cycloalkyl group having 3 to 6 carbon atoms, and an aryl group having 6 to 12 carbon atoms.

8. The method of claim 1, wherein the nuclear growth retardant is represented by the following Chemical Formula 7:

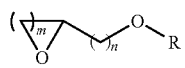

<Chemical Formula 7> in <Chemical Formula 7>, n is each independently an integer of 0 to 5, m is each independently an integer of 1 to 5, R is each independently selected from an alkyl group having 1 to 10 carbon atoms, a cycloalkyl group having 3 to 10 carbon atoms, and an aryl group having 6 to 12 carbon atoms.

9. The method of claim 1, wherein the nuclear growth retardant is represented by the following Chemical Formula 8:

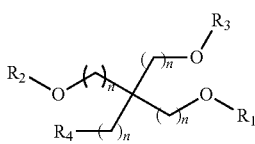

<Chemical Formula 8> in <Chemical Formula 8>, n is each independently an integer of 0 to 8,

R1 to R3 are each independently selected from an alkyl group having 1 to 8 carbon atoms, R4 is each independently selected from a hydrogen, an alkyl group having 1 to 6 carbon atoms, and an alkoxy group having 1 to 8 carbon atoms.

10. The method of claim 1, wherein the non-growth region is a metal-containing film having at least one of Group 1 to Group 13 elements as a pivotal element.

11. The method of claim 10, wherein the metal-containing film has at least one of Group 4 elements including Zr, Hf, and Ti as a pivotal element.

12. The method of claim 10, wherein the metal-containing film has at least one of Group 5 elements including Nb and Ta as a pivotal element.

13. The method of claim 10, wherein the metal-containing film has at least one of Group 6 elements including W as a pivotal element.

14. The method of claim 10, wherein the metal-containing film has at least one of Group 11 elements including Cu as a pivotal element.

15. The method of claim 10, wherein the metal-containing film has at least one of Group 13 elements including Al as a pivotal element.

16. The method of claim 10, wherein the metal-containing film is a metal itself.

17. The method of claim 10, wherein the metal-containing film is a metal oxide.

18. The method of claim 10, wherein the metal-containing film is a metal nitride.

19. The method of claim 1, wherein the growth region has at least one of Group 14 elements including Si, Ge as a pivotal element.

20. The method of claim 1, wherein the growth region is a silicon-containing film.

21. The method of claim 20, wherein the silicon-containing film is at least one selected from Si, SiO, SiN, SiCN, C-doped SiN, and SiON.

22. The method of claim 1, wherein the growth region is a germanium-containing film.

23. The method of claim 1, wherein the precursor is an organic compound having at least one of Group 14 elements including Si and Ge as a pivotal element.

24. The method of claim 23, wherein the precursor is represented by the following Chemical Formula 9:

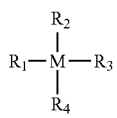

<Chemical Formula 9> in <Chemical Formula 9>, M is one of Group 14 elements including Si and Ge,

R1 to R4 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

25. The method of claim 23, wherein the precursor is represented by the following Chemical Formula 10:

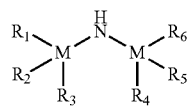

<Chemical Formula 10> in <Chemical Formula 10>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

26. The method of claim 23, wherein the precursor is represented by the following Chemical Formula 11:

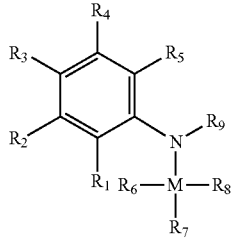

<Chemical Formula 11> in <Chemical Formula 11>, M is one of Group 14 elements including Si and Ge,

R1 to R5 are each independently selected from a hydrogen, an alkyl group having 1 to 10 carbon atoms, R6 to R9 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

27. The method of claim 23, wherein the precursor is represented by the following Chemical Formula 12:

<Chemical Formula 12>

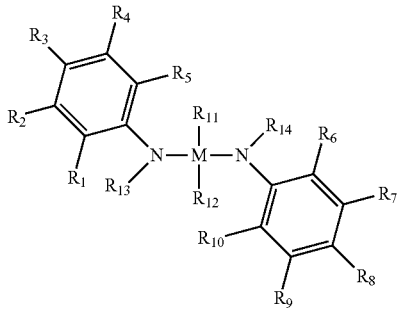

in <Chemical Formula 12>, M is one of Group 14 elements including Si and Ge,

R1 to R10 are each independently selected from a hydrogen, an alkyl group having 1 to 10 carbon atoms, R11 to R14 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

28. The method of claim 23, wherein the precursor is represented by the following Chemical Formula 13:

<Chemical Formula 13>

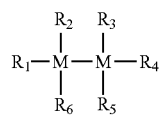

in <Chemical Formula 12>, M is one of Group 14 elements including Si and Ge,

R1 to R6 are each independently selected from a hydrogen, an alkyl group having 1 to 10 carbon atoms, an aryl group having 6 to 12 carbon atoms, an alkylamine group having 1 to 10 carbon atoms, a dialkyl amine group having 1 to 10 carbon atoms, an arylamine group having 6 to 12 carbon atoms, an aralkylamine group having 7 to 13 carbon atoms, a cyclic amine group having 3 to 10 carbon atoms, a heterocyclic amine group having 3 to 10 carbon atoms, a heteroarylamine group having 6 to 12 carbon atoms, an alkyl silylamine group having 2 to 10 carbon atoms, an azide group, and a halogen.

29. The method of claim 1, wherein the reaction material is at least one selected from O3, O2, H2O, H2O2, N2O, and NH3.

30. The method of claim 1, wherein the thin film is formed by a Metal Organic Chemical Vapor Deposition (MOCVD) or an Atomic Layer Deposition (ALD).

* * * * *